United States Patent [19]

Wakai et al.

[11] Patent Number: 5,229,644
[45] Date of Patent: Jul. 20, 1993

[54] THIN FILM TRANSISTOR HAVING A TRANSPARENT ELECTRODE AND SUBSTRATE

[75] Inventors: Haruo Wakai, Fussa; Nobuyuki Yamamura, Hannou; Syunichi Sato, Kowagoe; Minoru Kanbara, Hachioji, all of Japan

[73] Assignee: Casio Computer Co., Ltd., Tokyo, Japan

[21] Appl. No.: 831,002

[22] Filed: Feb. 5, 1992

Related U.S. Application Data

[60] Continuation of Ser. No. 503,883, Apr. 3, 1990, abandoned, which is a division of Ser. No. 241,304, Sep. 7, 1988, Pat. No. 5,032,883.

[30] Foreign Application Priority Data

Sep. 9, 1987 [JP] Japan ................... 62-225819
Sep. 25, 1987 [JP] Japan ................... 62-241607
Oct. 1, 1987 [JP] Japan ................... 62-248878

[51] Int. Cl.$^5$ ............... H01L 29/10; H01L 29/78; H01L 27/01; H01L 27/13
[52] U.S. Cl. ............... 257/749; 257/59; 257/72
[58] Field of Search ............ 357/30, 23, 23.4, 23.7, 357/4, 71, 2; 359/87, 58; 257/59, 66, 72, 80, 82, 449, 749

[56] References Cited

U.S. PATENT DOCUMENTS

| | | |
|---|---|---|
| 3,765,747 | 10/1973 | Pankratz . |
| 3,840,695 | 10/1974 | Fischer . |
| 3,862,360 | 1/1975 | Dill . |
| 4,115,799 | 9/1978 | Luo et al. . |
| 4,413,883 | 11/1983 | Baraff et al. . |
| 4,514,253 | 4/1985 | Minezaki . |
| 4,582,395 | 4/1986 | Morozumi . |
| 4,601,097 | 7/1986 | Shimbo ........................ 357/30 |
| 4,646,424 | 3/1987 | Parks et al. ................... 29/591 |
| 4,687,298 | 8/1987 | Aoki et al. . |
| 4,704,002 | 11/1987 | Kikuchi et al. . |
| 4,704,559 | 11/1987 | Suginoya et al. . |
| 4,705,358 | 11/1987 | Yamazaki . |
| 4,732,873 | 3/1988 | Perbet et al. . |
| 4,733,948 | 3/1988 | Kitahara . |
| 4,758,896 | 7/1988 | Ito ........................... 357/23.7 |
| 4,759,610 | 7/1988 | Yanagisawa . |
| 4,776,673 | 10/1988 | Aoki et al. . |
| 4,778,773 | 10/1988 | Sukegawa . |
| 4,788,445 | 11/1988 | Hatanaka et al. .............. 357/30 |
| 4,816,885 | 3/1989 | Yoshida et al. . |
| 4,821,092 | 4/1989 | Noguchi ...................... 357/23.7 |
| 4,853,755 | 8/1989 | Okabe . |
| 4,862,237 | 8/1989 | Morozumi . |
| 4,917,471 | 4/1990 | Takao et al. . |
| 4,928,161 | 5/1990 | Kobayashi . |
| 4,935,792 | 6/1990 | Tanaka et al. . |

FOREIGN PATENT DOCUMENTS

| | | |
|---|---|---|
| 16-8172 | 4/1941 | Japan . |
| 19-5572 | 2/1944 | Japan . |
| 55-32026 | 3/1980 | Japan . |
| 56-69683 | 6/1981 | Japan . |
| 56-140321 | 11/1981 | Japan . |

(List continued on next page.)

OTHER PUBLICATIONS

The TFT-A New Thin-Film Transistor, Paul K. Weimer, Proceedings of the IRE, pp. 1462-1469, Jun.
IEEE Transactions on Electron Devices, Nov. 1973, vol. ED-20, No. 11, T. P. Brody et al, "A 6×6 Inch 20
(List continued on next page.)

Primary Examiner—Andrew J. James
Assistant Examiner—Carl Whitehead, Jr.
Attorney, Agent, or Firm—Frishauf, Holtz, Goodman & Woodward

[57] ABSTRACT

A TFT is formed on a transparent insulative substrate, and includes a gate electrode, a gate insulating film, a semiconductor film which has a channel portion, source and drain electrodes. An insulating film is formed on the TFT so as to cover at least the drain electrode and the gate insulating film. A transparent electrode is formed on at least part of insulating film except for a portion above the channel portion on the semiconductor film. The transparent electrode is electrically connected to the source electrode via a through hole which is formed on the insulating film at a position of the source electrode.

18 Claims, 12 Drawing Sheets

FOREIGN PATENT DOCUMENTS

| | | |
|---|---|---|
| 57-20778 | 2/1982 | Japan . |
| 58-21784 | 2/1983 | Japan . |
| 58-114453 | 7/1983 | Japan . |
| 59-15499 | 4/1984 | Japan . |
| 60-43631 | 3/1985 | Japan . |
| 60-92663 | 5/1985 | Japan . |
| 60-170261 | 9/1985 | Japan . |
| 61-5576 | 1/1986 | Japan . |
| 61-5577 | 1/1986 | Japan . |
| 0615576 | 1/1986 | Japan .................................. 357/23.4 |
| 61-153619 | 7/1986 | Japan . |
| 61-187272 | 8/1986 | Japan . |
| 61-191072 | 8/1986 | Japan . |
| 61-220369 | 9/1986 | Japan . |
| 62-8569 | 1/1987 | Japan . |
| 62-8570 | 1/1987 | Japan . |
| 63-128756 | 6/1988 | Japan . |
| 63-197377 | 8/1988 | Japan . |
| 64-48463 | 2/1989 | Japan . |
| 1-105575 | 4/1989 | Japan . |
| 1-137674 | 5/1989 | Japan . |
| 61185522 | 7/1989 | Japan . |
| 1-227475 | 9/1989 | Japan . |

OTHER PUBLICATIONS

Lines-Per-Inch Liquid-Crystal Display Panel", pp. 995–1001.

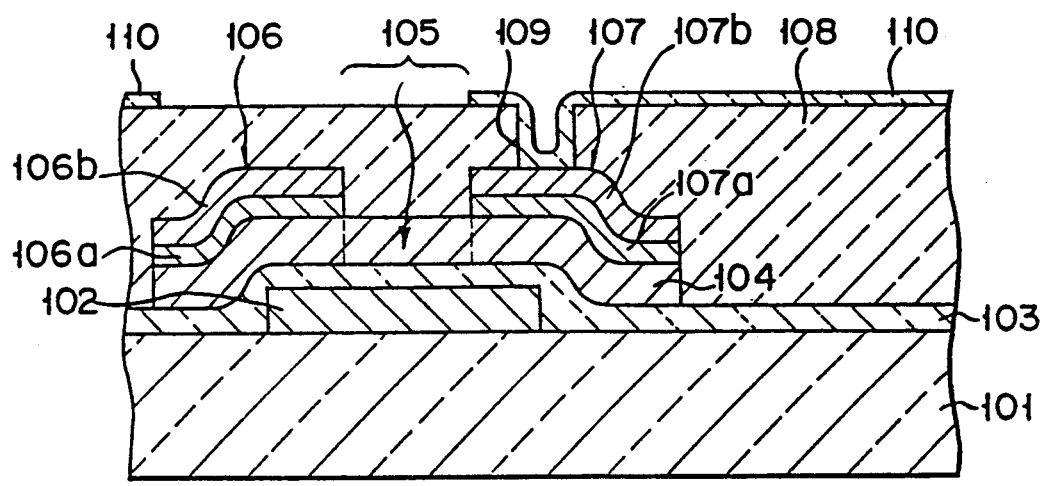
F I G. 3

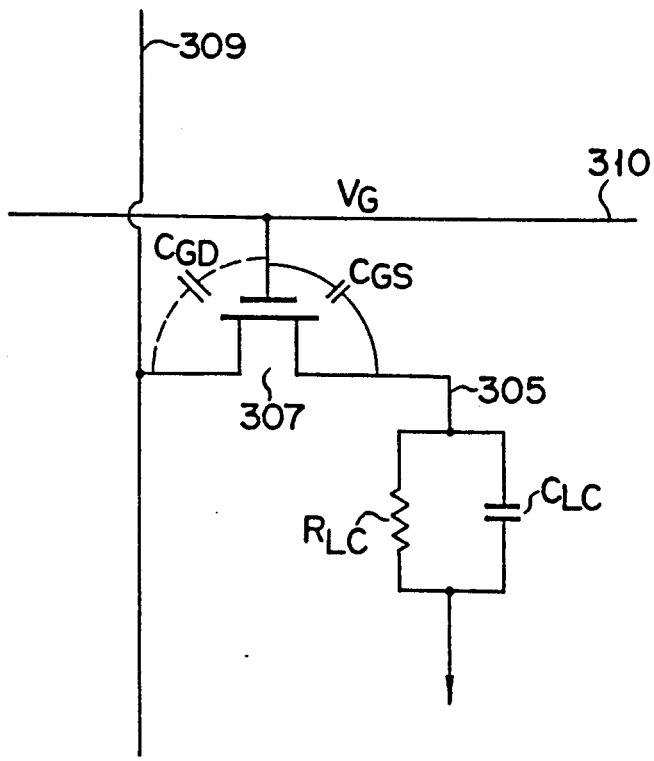
F I G. 18

THIN FILM TRANSISTOR HAVING A TRANSPARENT ELECTRODE AND SUBSTRATE

CROSS-REFERENCE TO THE RELATED APPLICATION

This application is a continuation of Ser. No. 07/503,883 filed Apr. 3, 1990 (now abandoned), which is a divisional of Ser. No. 07/241,304 filed Sep. 7, 1988 (now U.S. Pat. No. 5,032,883 issued Jul. 16, 1991).

BACKGROUND OF THE INVENTION

1. Field of the Invention

The present invention relates to a thin film transistor (to be referred to as a TFT hereinafter) formed by stacking thin films, such as a gate electrode, a gate insulating film, a semiconductor, a source electrode, and a drain electrode, on a transparent insulating substrate, and a method of manufacturing the same.

2. Description of the Related Art

Conventional TFTs as switching elements are disclosed in Japanese Utility Model Publication No. 44-5572 (U.S. Ser. No 132,095), Japanese Patent Publication No. 41-8172 (U.S. Ser. No. 344,921), and P. K. Weimer, "The TFT — A New Thin-Film Transistor", PROCEEDINGS OF THE IRE, June, 1962. Liquid crystal display panels using such TFTs are disclosed in "A 6×6 Inch 20 lines-Per-Inch Liquid Crystal Display Panel", IEEE Transactions on Electron Device, vol. ED-20, No. 11, November 1973 and U.S. Pat. No. 3,840,695.

On the other hand, U.S. Pat. Nos. 3,765,747 and 3,862,360, and Japanese Patent Disclosure (Kokai) Nos. 55-32026, 57-20778, and 58-21784 disclose a technique wherein a MOS transistor is formed on a monocrystalline semiconductor substrate, and the resultant structure is used as one of the substrates of a liquid crystal display panel. However, if liquid crystal panels are constituted by these semiconductor substrates, only reflection type displays can be obtained. In addition, the manufacturing process of such panels are as complex as that of LSIs. Moreover, it Is difficult to obtain a large display panel.

The above-described active matrix liquid crystal panels, therefore, currently use the TFTs as switching elements. The structures of these TFTs can be classified into a coplanar type, an inverted coplanar type, a staggered type, and an inverted staggered type, as disclosed in the article by P. K. Weimer. Of these types, the inverted staggered type TFT can be formed by stacking a plurality of thin films successively in a vacuum. For this reason, the number of manufacturing steps is substantially decreased. As a result, the characteristics of a product are stabilized, and the rate of occurrence of defective transistors is decreased.

FIGS. 1 and 2 show structures of the above-described inverted staggered type TFT and a TFT array obtained by arranging a plurality of such inverted staggered type TFTs on an insulating substrate. Referring to FIGS. 1 and 2, a plurality of TFTs 1 are arranged on a transparent insulating substrate 2 in the form of a matrix. Gate electrodes 3 of TFTs 1 are commonly connected through a gate line 4 in the row direction. Drain electrodes 5 of TFTs 1 are commonly connected through a drain line 6 in the column direction. A source electrode 7 of each TFT 1 is connected to a transparent electrode 8 independently formed in an area surrounded by the gate and drain lines 4 and 6 (an electrode to which a data signal is supplied will be referred to as a drain electrode hereinafter). More specifically, as shown in FIG. 2, the gate electrode 3 consisting of Cr or the like is formed on the transparent glass substrate 2, and a gate insulating film 9 consisting of silicon oxide or silicon nitride is formed on the upper surface of the glass substrate 2 including the upper surface of the gate electrode 3. A semiconductor film 10 consisting of amorphous silicon is stacked on the gate insulating film 9 above the gate electrode 3. Drain and source electrodes 5 and 7 are formed on the semiconductor film 10. They are separated from each other by a predetermined distance so as to form channel portion 11. Drain and source electrodes 5 and 7 respectively have contact layers $5a$ and $7a$, and metal layers $5b$ and $7b$, and are electrically Connected to the semiconductor 10. The source electrode 7 is connected to the transparent electrode 8 consisting of Indium-Tin-Oxide (to be referred to as an ITO hereinafter).

In the TFT used for the above-described TFT array, since part of the drain electrode 5, the drain line 6, and the transparent electrode 8 are formed on the gate insulating film 9, both the electrodes tend to be short-circuited, and hence the rate of occurrence of defects becomes high. Especially in the TFT array using this TFT, since the transparent electrode 8 is formed in a region surrounded by the gate and drain lines 4 and 6, short-circuiting tends to occur between the transparent electrode 8 and the drain line 6.

In order to prevent such short-circuiting, predetermined distance L determined by process and alignment precision in formation of the transparent electrode 8 and the drain line 6 is formed therebetween. Distance L is normally set to be a large value, e.g., 20 $\mu$m or more. Although the formation of such large distance L can prevent the above-described short-circuiting, the area of the transparent electrode 8 is reduced. That is, the problem of reduction in effective display area is posed. For example, the opening ratio, i.e., the ratio of the area of the transparent electrode 8 to an area for arranging one TFT and one transparent electrode on the glass substrate 2 becomes as small as about 50% even if distance L is set to be a minimum value of 20 $\mu$m.

As described with reference to Japanese Patent Disclosure (Kokai) No. 55-32026, in the transistor array obtained by arraying MOS transistors using the monocrystalline semiconductor substrate, unevenness of the upper surface of the substrate occurs because of the formation of the transistors. Therefore, in order to flatten the upper surface and form a uniform orientation film, an insulating film is deposited on the transistors, and reflecting electrodes for receiving data signals are formed on the insulating film. According to such a transistor having a MOS structure, since the gate electrode is formed on the semiconductor substrate, an unnecessary electric filed is not applied to the channel portion by a data signal supplied to the transparent electrode formed above the channel portion. In the above-described inverted staggered type TFT, however, since the gate electrode is formed on the substrate, electric fields tend to be applied to the semiconductor film from electrodes other than the gate electrode.

It is, therefore, difficult to obtain a TFT which can be stably operated without causing short-circuiting between the drain electrode and drain line, and the transparent electrode connected to the source electrode,

SUMMARY OF THE INVENTION

The present invention has been made in consideration of the above-described technical problems, and has as its object to provide a TFT which can be stably operated, has a small rate of occurrence of defects, and can be easily manufactured, and a method of manufacturing the same.

In order to achieve this object, a TFT according to the present invention comprises:

a transparent insulative substrate;

a gate electrode formed on the substrate;

a gate insulating film formed on at least the gate electrode;

a semiconductor film formed at a position on the gate insulating film corresponding to the gate electrode;

source and drain electrodes formed on at least a portion of the semiconductor film corresponding to the gate electrode so as to be separated from each other by a predetermined distance to form a channel portion on the semiconductor film, the source and drain electrodes being electrically connected to the semiconductor film;

an insulating film covering at least the drain electrode; and a transparent electrode formed on at least part of the insulating film except for a portion above the channel portion on the semiconductor film, and electrically connected to the source electrode.

According to the TFT of the present invention having the above-described arrangement, since the insulating film is formed on the drain electrode, and the transparent electrode electrically connected to the source electrode is formed on the resultant structure, these electrodes are not short-circuited. In addition, since the TFT of the present invention is of an inverted staggered type, the respective films to be stacked can be formed in successive steps. Therefore, the manufacture can be facilitated.

Moreover, according to a TFT array obtained by arraying a plurality of TFTs of the present invention on a transparent glass substrate, since the substrate consists of a glass, a transmission type display device can be obtained. In this case, since a pixel electrode constituted by the transparent electrode connected to the source electrode is not short-circuited to the drain electrode and drain line, the pixel electrode can be arranged near the drain electrode and drain line, or can be overlapped thereon. As a result, the opening ratio of the display becomes very high.

BRIEF DESCRIPTION OF THE DRAWINGS

FIG. 3 is a sectional view showing a TFT according to a first embodiment of the present invention;

FIG. 18 shows an equivalent circuit diagram of a liquid crystal display element using the TFT in FIGS. 14 and 16.

DETAILED DESCRIPTION OF THE PREFERRED EMBODIMENTS

Figure 1:
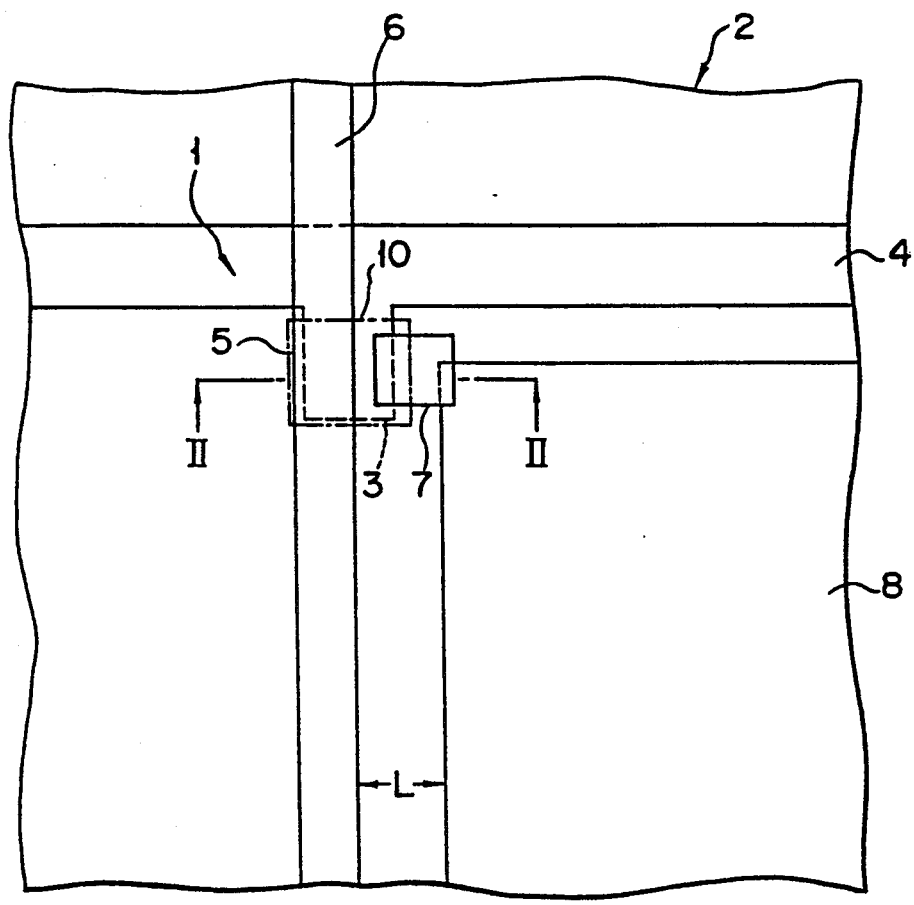
FIG. 1 is a plan view showing a prior art.
Figure 2:
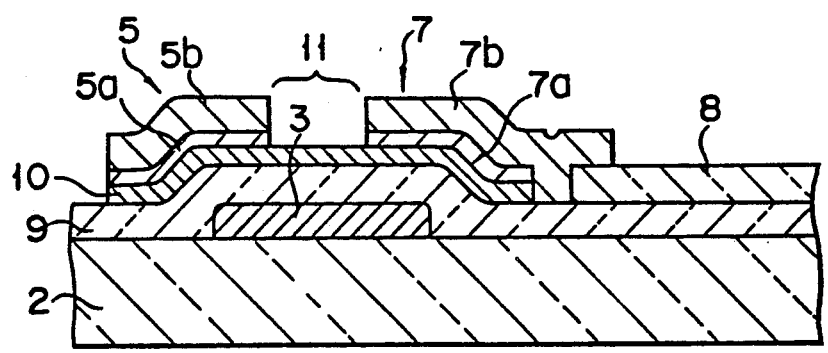
FIG. 2 is a sectional view showing the prior art in FIG. 1 taken along line II—II thereof.

Embodiments of the present invention will be described in detail below with reference to the accompanying drawings.

FIG. 3 shows a sectional structure of a TFT according to the present invention. A first embodiment will be described below with reference to FIG. 3. Gate electrode 102 consisting of Cr and having a thickness of about 1,000 Å is formed on an insulating substrate 101 consisting of a transparent glass plate. A gate insulating film 103 consisting of silicon nitride or silicon oxide and having a thickness of about 3,000 Å is formed on the upper surface of the insulating substrate 101 including the upper surface of the gate electrode 102. A semiconductor film 104 consisting of amorphous silicon and having a thickness of about 1,000 Å is formed on the gate insulating film 103 so as to cover a portion above the gate electrode 102 and its peripheral portion. Drain and source electrodes 106 and 107 are formed on the semiconductor film 104. They are separated from each other by a predetermined distance so as to form a channel portion 105. In order to electrically connect the drain and the source electrodes 106 and 107 to the semiconductor film 104, the electrodes 106 and 107 are respectively constituted by the contact films 106a and 107a each consisting of amorphous silicon which is doped with an impurity at a high concentration and having a thickness of about 500 Å, and conductive layers 106b and 107b each consisting of a conductive metal material such as Cr and having a thickness of about 1,000 Å. In addition, a transparent insulating film 108 consisting of $SiO_2$, polyimide, or an acrylic resin is deposited on substantially the entire exposed surface above the insulating substrate 101 on which the above-described films are stacked in a predetermined form.

The drain electrode 106 is covered with the insulating film 108 so as to be insulated from other electrodes. The thickness of the insulating film 108 on the drain and the source electrodes 106 and 107 is about 3,000 Å. The insulating film 108 fills recesses generated upon formation of the above thin films and flattens the surface above the insulating substrate 101. A through hole 109 extending through the insulating film 108 is formed in a portion of the insulating film 108 above the source electrode 107. In addition, a transparent electrode 110 consisting of ITO and having a thickness of about 1,000 Å is formed on the upper surface of the insulating film 108. The transparent electrode 110 extends into the through hole 109 and hence is electrically connected to the source electrode 107. A portion of the transparent electrode 110 above a channel portion 105 of the semiconductor film 104 formed between the drain and the source electrodes 106 and 107, and its portion above the drain electrode 106 is mostly removed. That is, the transparent electrode 110 above the channel portion 105 must be removed so as to prevent an unnecessary electric field from being applied to the channel portion 105. Furthermore, in order to decrease a parasitic capacitance, the transparent electrode 110 is formed above the drain electrode 106 such that its edge slightly overlaps the edge of the drain electrode 106. Note that since the parasitic capacitance is small, the transparent electrode 110 may overlap the drain electrode 106. If the thickness of the insulating film 108 on the drain and the source electrodes 106 and 107 is excessively small, the insulation property is degraded. In contrast to this, if it is excessively large, connection to the transparent electrode through hole 109 formed on the source electrode 107 becomes difficult. For this reason, the thickness of the insulating film 108 preferably falls within the range of 2,000 to 8,000 Å.

In the TFT having the above structure, since the insulating film 108 is formed at least on the drain electrode 106, the probability of short-circuiting between the drain and the source electrodes 106 and 110 is considerably decreased. In addition, since the transparent electrode 110 is not present above the channel portion 105 of the semiconductor film 104, an unnecessary electric field is not applied to the channel portion 105, and hence the TFT can be stably operated.

A method of manufacturing the TFT according to the first embodiment of the present invention will be described below with reference to FIGS. 4A to 4F.

Figure 4A:
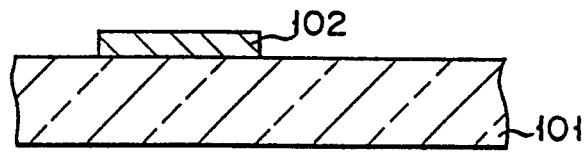
FIGS. 4A to 4F are sectional views for explaining the steps in manufacturing the TFT of the present invention in FIG. 3.

As shown in FIG. 4A, a metal film having a thickness of, e.g., about 1,000 Å is deposited by sputtering or vapor deposition on the transparent insulating substrate 101 having a cleaned surface. The metal film is patterned by photolithography or the like to form the gate electrode 102. The insulating substrate 101 may consist of glass, quartz, sapphire, or the like. The gate electrode 102 consists of chromium, titanium, tungsten, tantalum, copper, or the like.

Figure 4B:
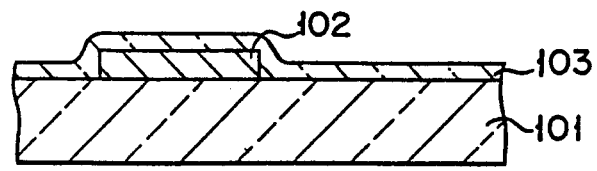
Figure 4C:
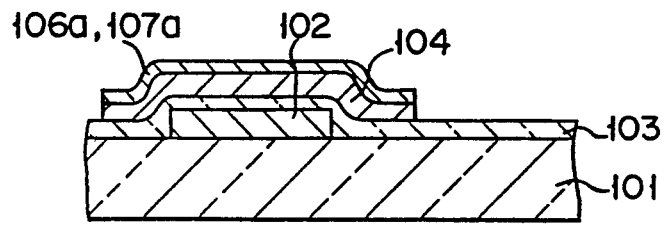

As shown in FIG. 4B, the gate insulating film 103 is then formed on the entire surface of the insulating substrate 101 by plasma CVD or the like so as to have a thickness of, e.g., 3,000 Å and cover the gate electrode 102. A silicon nitride (SiN) film, silicon oxide ($SiO_2$) film, or the like is used as the gate insulating film 103. Subsequently, as shown in FIG. 4C, the semiconductor film 104 consisting of amorphous silicon (a-i-Si) or the like and the contact film 106a (107a) consisting of amorphous silicon (a-n+-Si) which is doped with an impurity at high concentration are continuously formed/stacked by plasma CVD or the like on the gate insulating film 103 so as to have thicknesses of, e.g., 1,000 Å and 500 Å, respectively. The semiconductor film 104 and the contact film 106a (107a) are patterned by photolithography or the like so as to cover a portion above the gate electrode 102 and its peripheral portion. Instead of the above amorphous silicon, amorphous silicon carbide (SiC), tellurium, selenium, gerumanium, cadmium sulfide (CdS), cadmium selenide (CdSe), or the like may be used as a material for semiconductor film 104 and contact film 106a (107a).

Figure 4D:
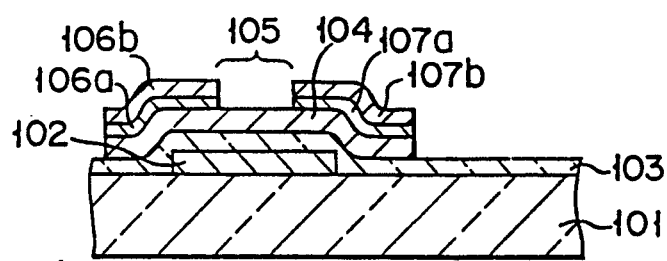

A 1,000-Å thick metal film is then formed on the entire surface above the insulating substrate 101 by vapor deposition, sputtering, or the like so as to cover the contact film 106a (107a). The metal film is patterned by photolithography or the like to remove the contact film 106a (107a) above the channel portion 105, thereby forming the drain and the source electrodes 106 and 107 above the gate electrode 102, which are separated from each other by a predetermined distance, as shown in FIG. 4D. Chromium, titanium, tungsten, tantalum, copper, or the like is used as a material for the metal films 106b and 107b of the drain and the source electrodes 106 and 107.

Figure 4E:
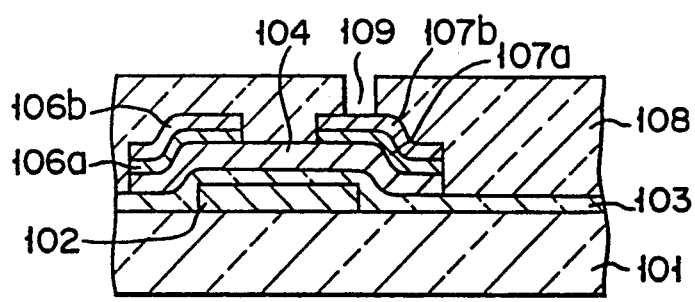

As shown in FIG. 4E, the transparent insulating film 108 is formed above the insulating substrate 101 so as to cover at least the drain electrode 106 and flatten the surface. As the transparent insulating film 108, an organic insulating film obtained by coating and baking polyimide or an acrylic resin using a spin coat method, or an $SiO_2$ inorganic insulating film (SOG film) obtained by coating and baking a silanol compound using a spin coat method is used. The thickness of the transparent insulating film 108 on the drain electrode 106 is about 3,000 Å. Subsequently, the through hole 109 is formed in the transparent insulating film 108 above the source electrode 107 by etching.

Figure 4F:
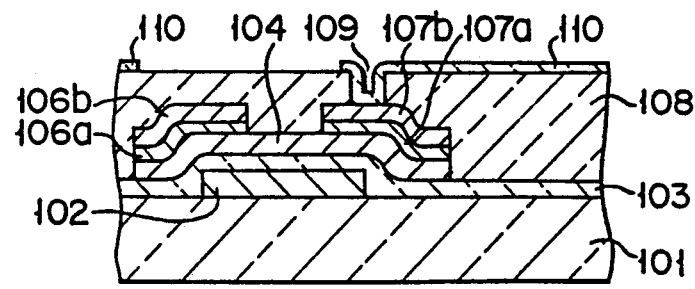

Finally, as shown in FIG. 4F, a transparent conductive material such as ITO, tine oxide ($SnO2$), or indium oxide ($In_2O_3$) is sputtered on the surface of the transparent insulating film 108 including the through hole 109 to a thickness of about 1,000 Å. Then, portions of this transparent conductive material above the channel portion 105 of the semiconductor film 104 and overlapping the drain electrode 106 through the transparent insulating film 108 are removed. With the above process, fabrication of the TFT is completed.

According to the above-described manufacturing method, since the step of forming the transparent electrode 110 in which a defect generally tends to occur becomes the last step, even if a defect occurs in this step, the immediately preceding step can be repeated, thereby reducing the ratio of occurrence of defects.

Figure 5:
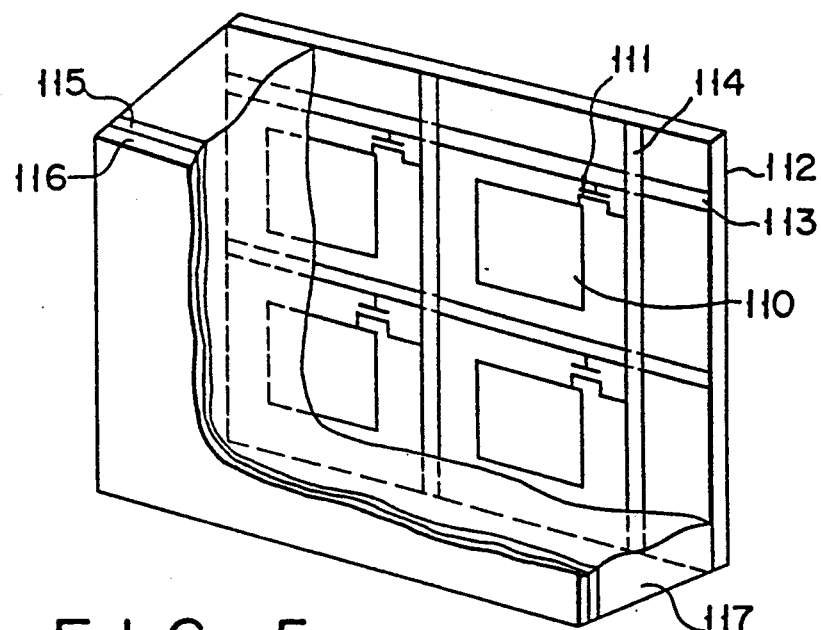
FIG. 5 is a schematic view showing an arrangement of a liquid crystal display element using the TFT of the present invention.
Figure 6:
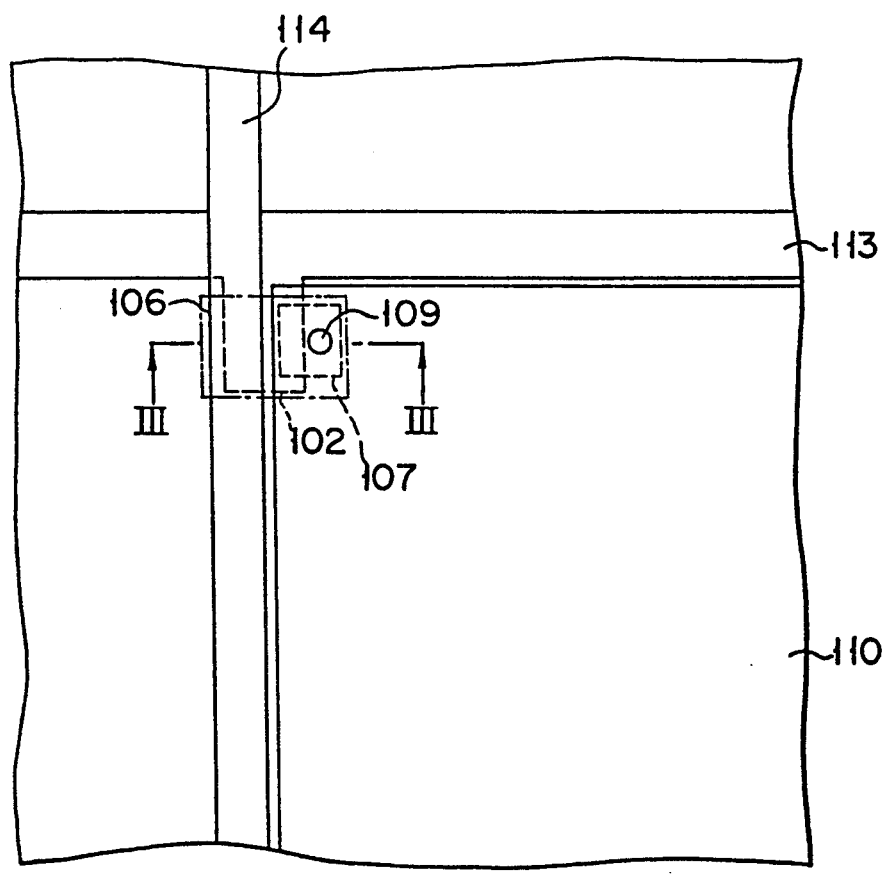
FIG. 6 is a partially enlarged view showing a TFT array obtained by arranging a plurality of TFTs of the present invention.

As shown in FIGS. 5 and 6, a plurality of TFTs of the present invention are arranged on a transparent insulating substrate in the form of a matrix, and are used as a liquid crystal display device. More specifically, a plurality of TFTs 111 are arrayed on a transparent insulating substrate 112 in the column and the row directions. Gate electrodes 102 of the respective TFTs are commonly connected to gate line 113 in the row direction. Drain electrodes 106 of the respective TFTs are commonly connected to drain line 114 in the column direction. Source electrodes 107 of TFTs 111 are connected to transparent electrodes 110, which are substantially formed into squares, through holes 109. Transparent electrodes 110 are respectively arranged in a plurality of regions surrounded by the gate and the drain lines 113 and 114, and are electrically independent from each other. The edges of each transparent electrode 110 are located near the gate and the drain lines 113 and 114, or slightly overlap them. The above-described sectional structure shown in FIG. 3 corresponds to a sectional structure taken along line III—III in FIG. 6.

Opposite a transparent substrate 116 having a transparent electrode 115 formed on its entire surface is placed on the substrate on which TFTs 111 are arranged in the form of a matrix in the above-described manner so as to oppose it. A liquid crystal display device is obtained by sealing liquid crystal 117 between these substrates. In this liquid crystal display device, one transparent electrode 110 is a pixel electrode corresponding to one pixel for image display. These pixel electrodes do not overlap the channel portions of the TFTs connected to the adjacent pixel electrodes, and areas where the pixel electrodes overlap the corresponding drain electrodes are minimized.

The above-described liquid crystal display device is operated in the following manner. Scan signals are sequentially supplied to a plurality of the gate lines 113. Data signals for controlling the ON/OFF states of the respective pixels are supplied to a plurality of the drain lines 114 in accordance with the timings of the scan signals. TFT 111 whose gate electrode 102 has received a scan signal is turned on, reads a data signal supplied at that timing, and supplies it to the pixel electrode 110. An electric field is applied to the liquid crystal 117 located between the pixel electrode which has received the data signal and the transparent electrode 115 of the opposite substrate 116 in accordance with a potential difference between the opposite electrodes. Then, the orientation state of the molecules of the liquid crystal 117 is changed, and thus transmission and interception of light are controlled.

As described above, according to the liquid crystal display device using the TFT of the present invention, since the transparent insulating film 108 is formed on at least the drain electrode 106 of the TFT, and the transparent electrode 110 is formed on the resultant structure, short-circuiting between the transparent electrode 110 and the drain electrode 106 can be prevented. In the distance between the transparent electrode 110 and the drain electrode 106, i.e., distance L in FIG. 1, can be set to be zero. Moreover, the transparent electrode 110 may be arranged so as to overlap the drain and the gate lines 114 and 113. With this arrangement, the entire region except for an opaque region (the semiconductor film 104, the source and the drain electrodes 107 and 106, and the gate and the drain lines 113 and 114) can be made an effective display area, and hence a maximum effective display area can be obtained. According to the embodiment, an opening ratio of 70% can be realized (50% in the conventional device). Since the step of forming the transparent electrode is the last one, and the source electrodes of all the TFTs are commonly connected upon deposition of the transparent conductive film before the step of separating the transparent conductive film individually is executed operations of all the TFTs can be measured within a short period of time by bringing the probe of a measuring device into contact with a plurality of the gate and the drain lines 113 and 114, and the transparent conductive film and supplying test signals.

Another embodiment of the present invention will be described below with reference to FIGS. 7 to 11, and FIGS. 12A to 12C. The same reference numerals in these drawings denote the same parts as in the first embodiment of FIG. 3, and a description thereof will be omitted.

Figure 7:
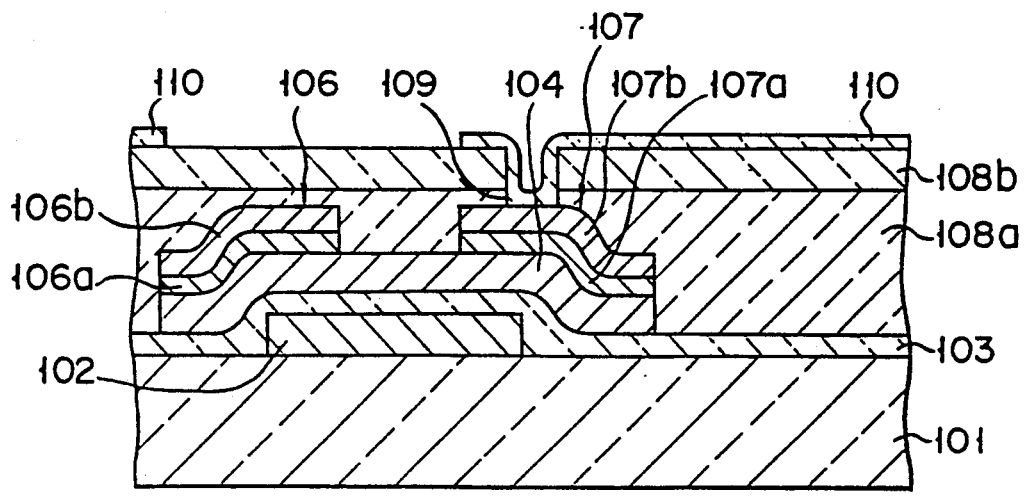
FIG. 7 is a sectional view showing a TFT array according to a second embodiment of the present invention.

FIG. 7 shows a second embodiment of the present invention. In the second embodiment, a first and a second insulating films 108a and 108b are deposited to cover a drain and a source electrodes 106 and 107, and a transparent electrode 110 is formed on the resultant structure. The first insulating film 108a is an $SiO_2$ film obtained by dissolving a silanol compound in a solvent, coating the resultant solution by a spin coat method, and baking the coated film. The first insulating film 108a is used to flatten the uneven surface above an insulating substrate. The second insulating film 108b is a nitride film obtained by chemical vapor deposition (CVD), and is used to improve an insulation property. According to the second embodiment, flattening of the surface above an insulating substrate 101 can be reliably performed, and the insulation property and the like can be reliably protected.

Figure 8:
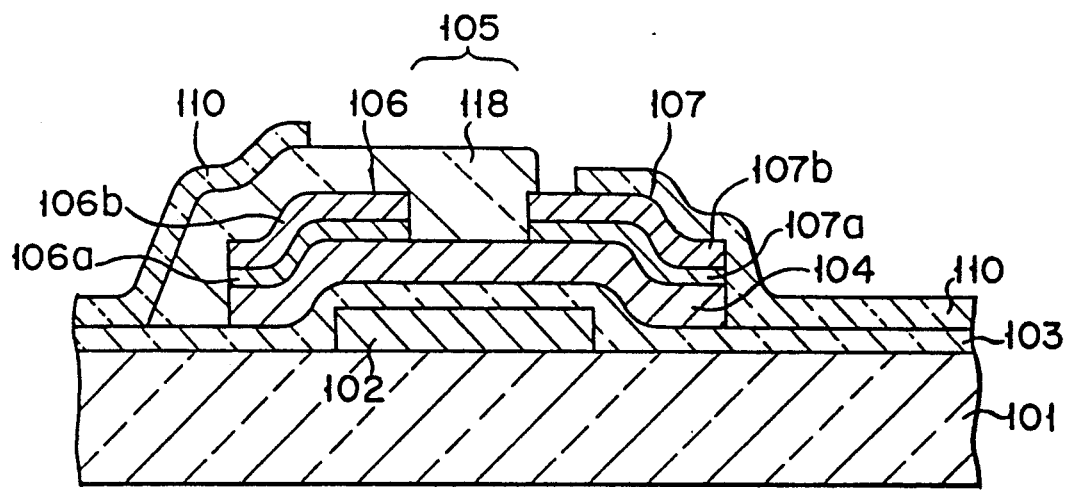
FIG. 8 is a sectional view showing a TFT array according to a third embodiment of the present invention.

FIG. 8 shows a third embodiment of the present invention. In the third embodiment, a transparent electrode 110 is formed without flattening the surface above an insulating substrate 101. An insulating film 118 is formed on only a channel portion 105 and a drain electrode 106 so as to protect the channel portion 105 and insulate the drain electrode 106 from the transparent electrode 110. Accordingly, the transparent electrodes 110 of one TFT and an adjacent TFT are not present above the channel portion 105, and the area where the transparent electrode 110 overlaps the drain electrode 106 is small. Therefore, short-circuiting between the transparent electrode 110 and the drain electrode 106 does not occur, and an electric field is not applied from the transparent electrode 110 to the channel portion 105.

Figure 9:
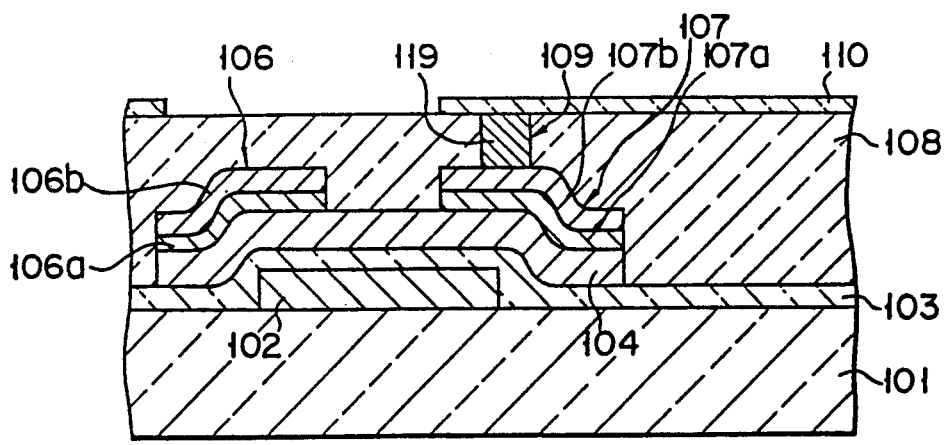
FIG. 9 is a sectional view showing a TFT array according to a fourth embodiment of the present invention.

FIG. 9 shows a fourth embodiment of the present invention. In the fourth embodiment, a contact metal 119 consisting of a conductive metal material is buried in a through hole 109 formed above a source electrode 107, and a transparent electrode 110 is deposited on the resultant structure, thereby electrically connecting the source electrode 107 to the transparent electrode 110. The contact metal 119 consists of nickel, gold, silver, chromium, or the like, and is formed in the through hole 109 by electroless plating. According to the fourth embodiment, since the source and the transparent electrodes 107 and 110 are connected to each other through the contact metal 119, electrical connection therebetween can be ensured.

Figure 10:
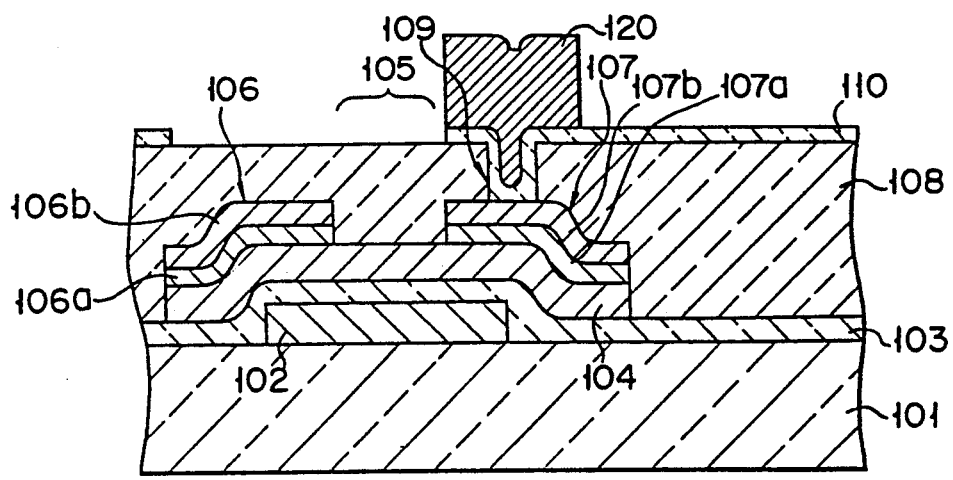
FIG. 10 is a sectional view showing a TFT array according to a fifth embodiment of the present invention.

FIG. 10 shows a fifth embodiment of the present invention. In the fifth embodiment, a contact metal 120 consisting of chromium, copper, aluminum, or the like is stacked on a transparent electrode 110, which is electrically connected to a source electrode 107, formed in a through hole 109 of a transparent film 108. According to the fifth embodiment, electrical connection between the source and the transparent electrodes 107 and 110 can be ensured.

Figure 11:
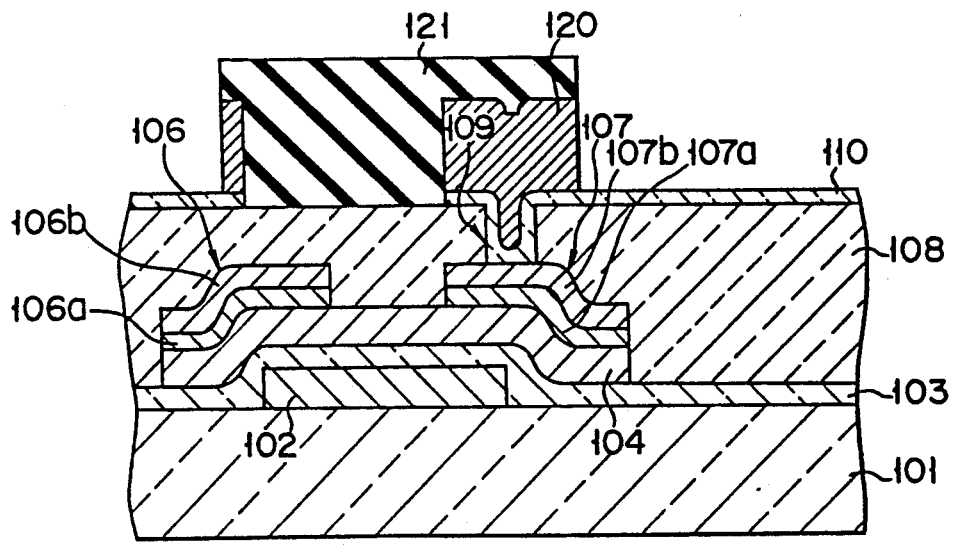
FIG. 11 is a sectional view showing a TFT array according to a sixth embodiment of the present invention.

FIG. 11 shows a sixth embodiment of the present invention. In the sixth embodiment, a shield film 121 is formed above a contact metal 120, a channel portion 105, and a drain electrode 106 shown in the fifth embodiment so as to prevent a decrease in OFF resistance of the TFT due to radiation of external light onto the channel portion 105.

The contact metal 120 and a shield film 121 in the sixth embodiment are formed in the following manner.

Figure 12A:
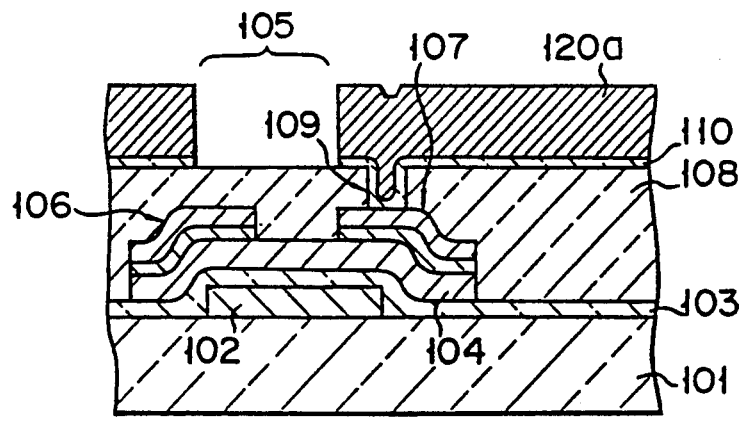
FIGS. 12A to 12C are sectional views for explaining the steps in manufacturing the TFT array according to the sixth embodiment in FIG. 11.
Figure 12B:
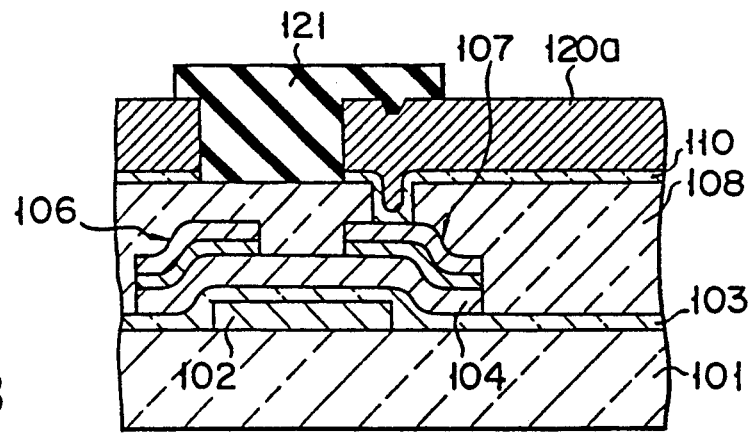
Figure 12C:
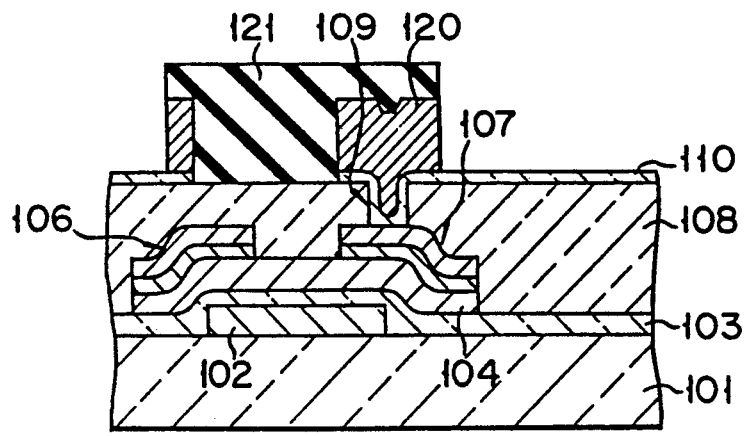

As shown in FIG. 12A, a transparent electrode film consisting of ITO and having a thickness of 500 to 1,000 Å and a metal conductive film 120a consisting of chromium, copper, or aluminum and having a thickness twice the depth of a through hole 109, e.g., about 6,000 Å are continuously stacked on the surface above an insulating substrate 101 including a transparent insulating film 108 and the through hole 109, and parts of the stacked films above the channel portion 105 and on a drain electrode 106 are removed. Subsequently, as shown in FIG. 12B, a shield material consisting of a non transparent and insulating resin or a metal oxide is stacked on the resultant structure. Then, the shield material is etched so as to be left on regions including a region above the through hole 109 of the metal conductive film 120a and a region above the channel portion 105, thereby forming a shield film 121. After this process, as shown in FIG. 12C, the metal conductive film 120a is etched by using the shield film 121 as a resist to remove the metal conductive film 120a from the surface of the transparent electrode 110, thereby forming the contact metal 120 on the through hole 109. According to the sixth embodiment, since the contact metal 120 is patterned by using the shield film 121 as a resist, the contact metal 120 can be formed substantially without increasing the number of steps in manufacturing.

Figure 13A:
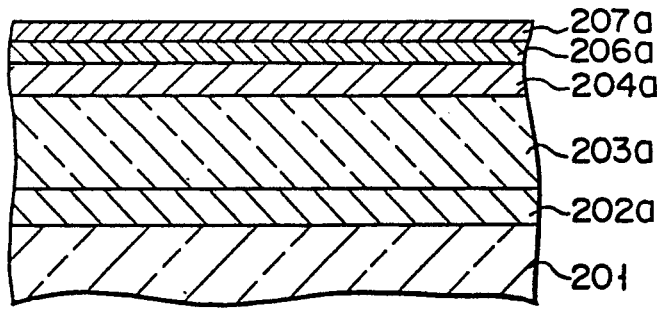
FIGS. 13A to 13G are sectional views for explaining the steps in manufacturing a TFT array to which the present invention can be applied.

A structure of a TFT to which the present invention can be applied will be described below. FIGS. 13A to 13G show the steps of manufacturing this TFT. FIG. 13G shows a finished TFT. As shown in FIG. 13G, in he TFT, a gate electrode 202, a gate insulating film 203, and a semiconductor film 204 are stacked on a transparent insulating substrate 201 and formed into the same shape. A contact films 206 each consisting of a semiconductor layer having a high impurity concentration, an ohmic contact electrodes 207, and a metal electrodes 209, all pairs of which have the identical shapes, are formed on the semiconductor film 204 so as to be separated from each other by a predetermined distance to form a channel portion 205. A drain and a source electrodes 211 and 210 are respectively constituted by the contact films 206, the ohmic contact electrodes 207, and metal electrodes 209. A transparent insulating film 208 is formed on a portion outside the stacked thin films to the height of the ohmic contact electrode 207. In addition, a pixel electrode 212 is formed on the transparent insulating film 208 so as to be in contact with the metal electrode 209 of the source electrode 210.

The TFT having the above-described arrangement is manufactured in the following manner. As shown in FIG. 13A, a metal film 202a consisting of chromium (Cr), molybdenum (Mo), tungsten (W), or the like is deposited on a cleaned surface of the transparent insulating substrate 201 to a thickness of, e.g., 1,000 Å by sputtering, vapor deposition, or the like. An insulating film 203a consisting of silicon nitride (SiN) or the like is deposited on the metal film 202a to a thickness of, e.g., about 3000 Å by plasma CVD or the like. Subsequently, an amorphous silicon (a-i-Si) film 204a and an n+-type amorphous silicon (a-n+-Si) film 206a doped with a high-concentration impurity are respectively deposited on the resultant structure to thicknesses of, e.g., about 1,000 Å and 500 Å by plasma CVD or the like. In addition, an ohmic contact film 207a consisting of Cr, Ti, a noble metal silicide such as PTSi or PT$_2$Si, or the like for an ohmic contact is deposited on the n+-type amorphous silicon 206a by sputtering or the like. The steps of stacking/forming the metal film 202a, the insulating film 203a, the amorphous silicon 204a the n+-type amorphous silicon 206a, and the ohmic contact film 207a on the transparent insulating substrate 201 are continuously performed by sputtering and plasma CVD.

Figure 13B:
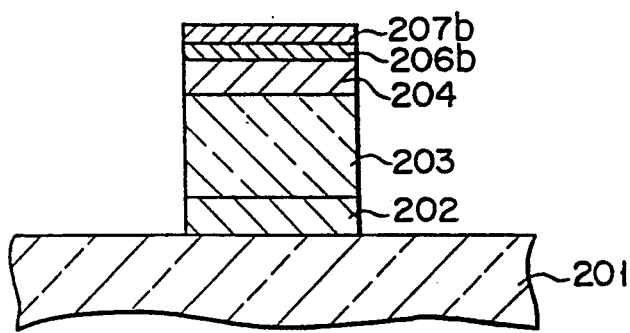
Figure 13C:
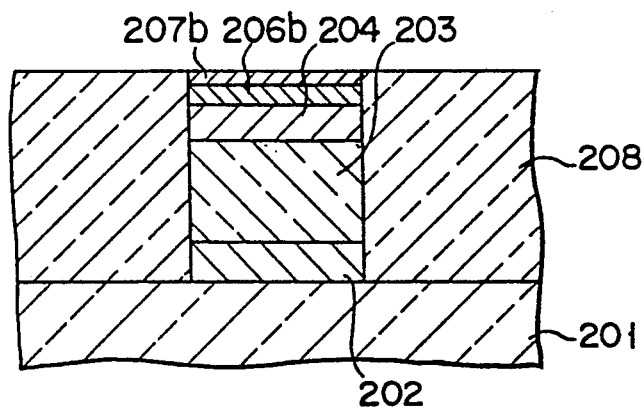
Figure 13D:
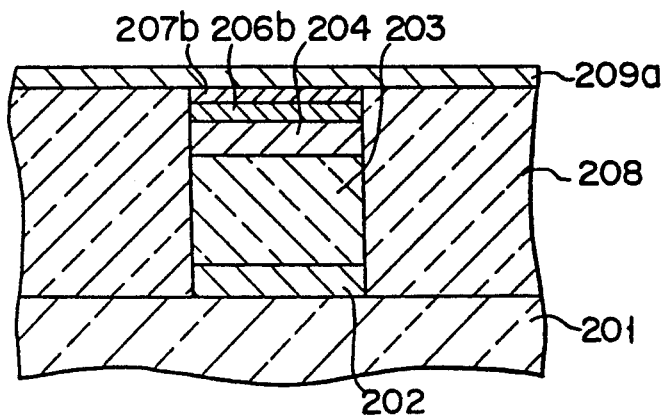

As shown in FIG. 13B, the ohmic contact film 207a, the n+-type amorphous silicon 206a, the amorphous silicon 204a the insulating film 203a, and the metal film 202a are etched to form the gate electrode 202, a gate line (not shown) for supplying scan signals to the gate electrode 202, the gate insulating film 203, the semiconductor film 204, the contact film portion 206b, and the ohmic contact electrode film 207b. The ohmic contact film 207a, the n+-type amorphous silicon 206a, the amorphous silicon 204a the insulating film 203a, and the metal film 202a are continuously etched by, e.g., reactive etching. Alternatively, the n+-type amorphous silicon 206a, the amorphous silicon 204a, the insulating film 203a may be etched by plasma etching, and the metal film 202a may be etched by wet etching. Then, as shown in FIG. 13C, the transparent insulating flattening film 208 consisting of a silica film or an organic substance such as acrylic is coated above the transparent insulating substrate 201 to a height substantially equal to that of the ohmic contact electrode film 207b by a spin coating method.

If the flattening film 208 is also coated on the ohmic contact electrode film 207b upon coating, the flattening film 208 on the film 207b is removed by etch back.

Figure 13E:
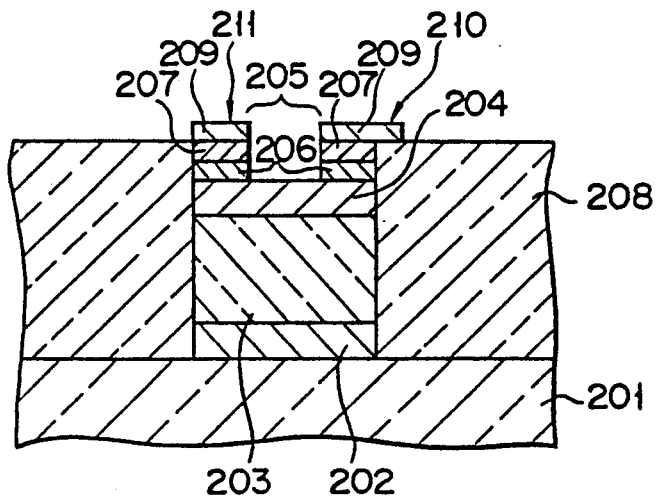

In addition, a metal film 209a having a small specific resistance, such as an aluminum (Al), copper (Cu), or silver (Ag) film, is deposited on the entire surfaces of the ohmic contact electrode film 207b and the flattening film 208 above the transparent insulating substrate 201 by sputtering, vapor deposition, or the like. Then, as shown in FIG. 13E, the corresponding position of the channel potion 205 of the metal film 209a, the ohmic contact metal film 207b, and the contact film portion 206b is continuously etched respectively by photolithography to form the drain and the source electrodes 211 and 210 each consisting of the metal electrode 209, the ohmic contact electrode 207, and the contact film 206, and to form a drain line for supplying image signals to the drain electrode 211.

Figure 13F:
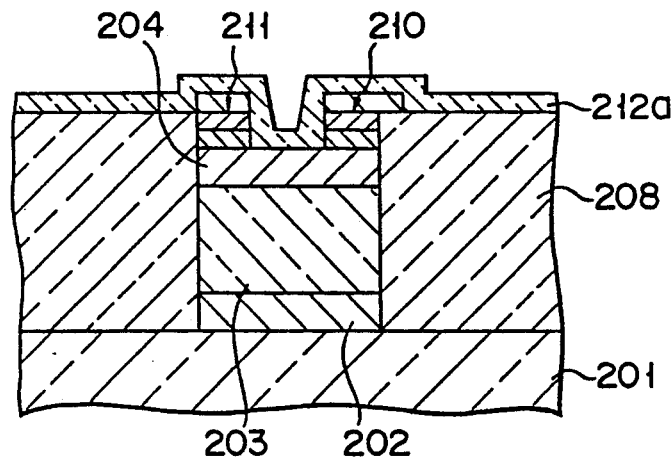
Figure 13G:
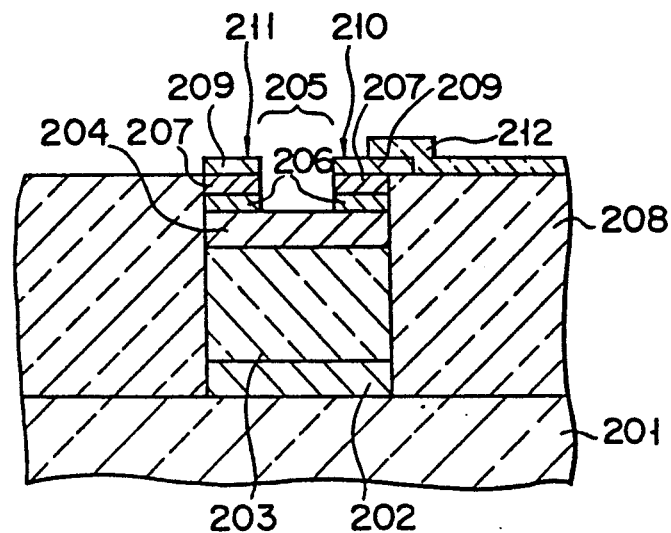

Subsequently, as shown in FIG. 13F, a transparent conductive film 212a such as an ITO film is deposited on the entire surface above the transparent insulating substrate 201 by vapor deposition or the like.

Finally, as shown in FIG. 13G, a pixel electrode 212 is formed by photolithography or the like. With this process, a TFT active matrix panel is completed. In the TFT of this embodiment, since the gate electrode 202, the gate insulating film 203, the semiconductor film 204, the contact film 206, and the ohmic contact electrode 207 can be successively formed in a series of steps, stable characteristics can be obtained. Since the stacked films obtained by the above-described series of steps are continuously etched, the number of steps is decreased.

Figure 14:
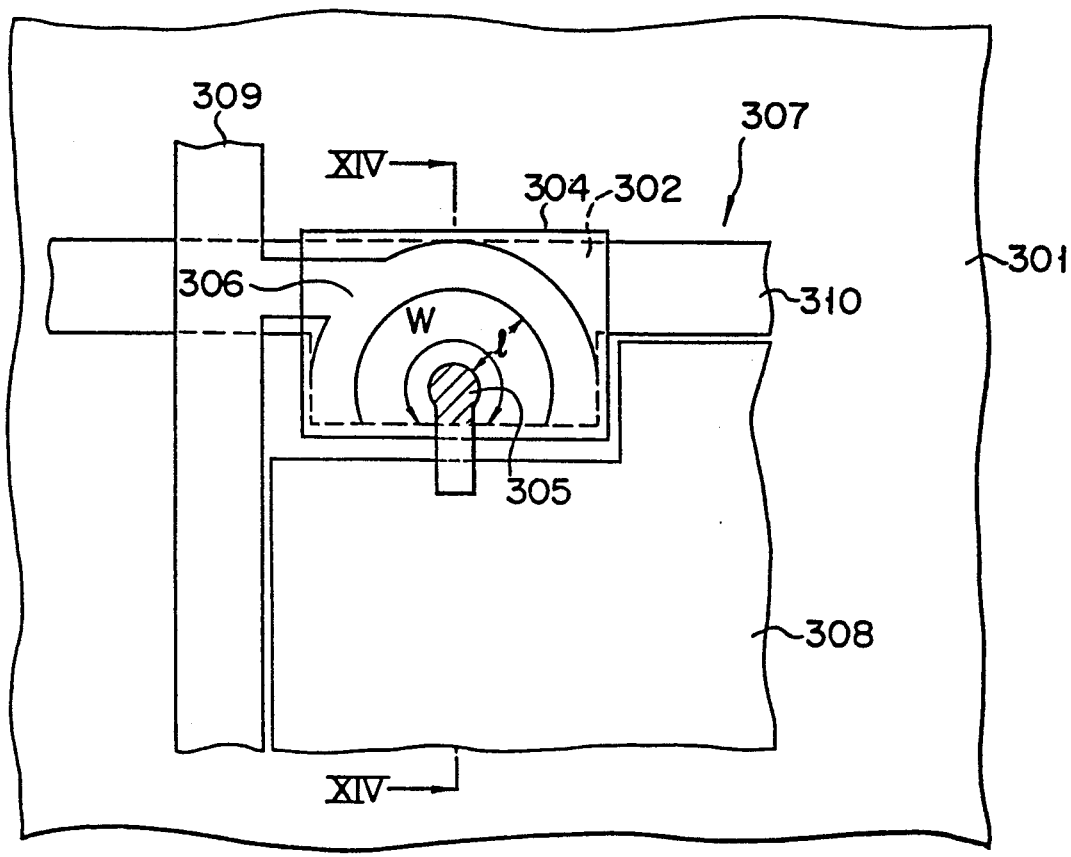
FIG. 14 is a plan view showing a structure of another TFT to which the present invention can be applied.
Figure 15:
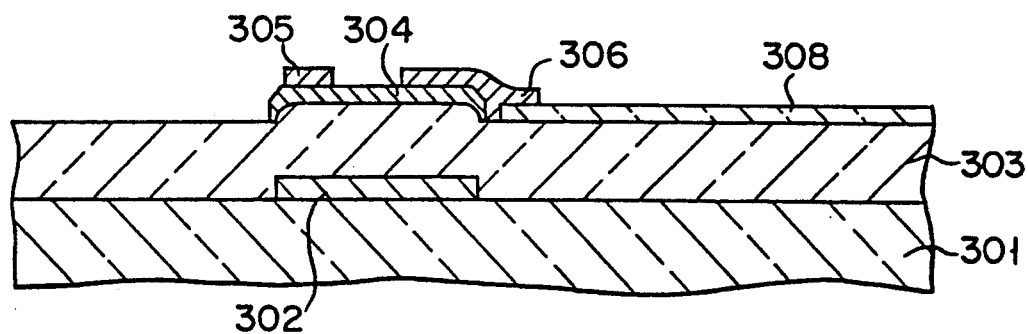
FIG. 15 is a sectional view showing the TFT in FIG. 14 taken along line XIV—XIV thereof.

A structure of another TFT to which the present invention can be applied will be described below. FIGS. 14 and 15 show this TFT. More specifically, a gate electrode 302 is formed on a glass substrate 301, and a gate insulating film 303 consisting of silicon nitride and having a thickness of about 3,000 Å is stacked on the gate electrode 302. A semiconductor film 304 consisting of amorphous silicon is stacked on part of the gate insulating film 303, which corresponds to the gate electrode 302. A circular source electrode 305 is formed on the semiconductor film 304. The source electrode 305 has a diameter of, e.g., about 4 μm. A drain electrode 306 is formed in an annular shape on the semiconductor film 304 substantially concentrically with the source electrode 305, thereby forming a semiconductor channel portion in a partial annular shape between the two electrodes. Since the channel portion is formed so as to surround the source electrode 305, if the distance between the two electrodes is a channel length l, and the length of an arc defined by substantially intermediate points of the channel length l is a channel width W, the channel width W is sufficiently larger than the channel length l. Ratio l/W of the channel length l to the channel width W is one or less.

A plurality of TFTs 307 each arranged in the above-described manner are arrayed on the substrate 301 in the form of a matrix. The source electrode 305 of TFT 307 is connected to a pixel electrode 308 consisting of a transparent conductive substance. The drain electrodes 306 of TFTs 307 arranged in the column direction are commonly connected to a drain line 309. The gate electrodes 302 of TFTs 307 arranged in the row direction are commonly connected to a gate line 310. In addition, a plurality of pixel electrodes 308 connected to source electrodes of TFTs 307 are arrayed above the glass substrate 301 in the form of a matrix.

In TFT 307, the source electrode 305 is formed so as to be smaller than the drain electrode 306. Therefore, the area where the source and the gate electrodes 305 and 302 overlap each other is considerably smaller than that where the drain and the gate electrodes 306 and 302 overlap each other. As indicated by an equivalent circuit diagram in FIG. 18, gate-source capacitance $C_{GS}$ present between the gate and the source electrodes 302 and 305 is very small. If, for example, the source electrode 305 is a circular electrode having a diameter of 4 μm and the gate insulating film 303 has a thickness of 3,000 Å as is the case with this embodiment, a gate-source capacitance $C_{GS}$ is as small as about 0.003 PF. Assuming that an equivalent capacitance $C_{LC}$ between two electrodes opposing each other through the pixel electrode 308 and a corresponding liquid crystal is set to be 0.1 PF (in a case wherein the area of the pixel electrode 308 is 100 μm × 100 μm), then a voltage drop ΔV across the source electrode 305 can be represented by:

$$\Delta V = \{C_{GS}/(C_{GS}+C_{LS})\} \cdot V_G = \{0.003/(0.003+0.1)\} \cdot V_G$$

This voltage drop is as small as about 3% of gate voltage $V_G$. As described above, since the area of the source electrode 305 is made small in this TFT, the gate-source capacitance $C_{GS}$ can be made small compared with the capacitance generated between one pixel electrode and an electrode opposing the pixel electrode through a liquid crystal. Therefore, the influences of gate signals on source potentials can be reduced, and the pixel electrode 308 can be micropatterned. In addition, since the drain electrode 306 is formed so as to surround the source electrode 305, a substantial channel width can be increased, and high drive performance of a thin film transistor can be realized.

Figure 16:
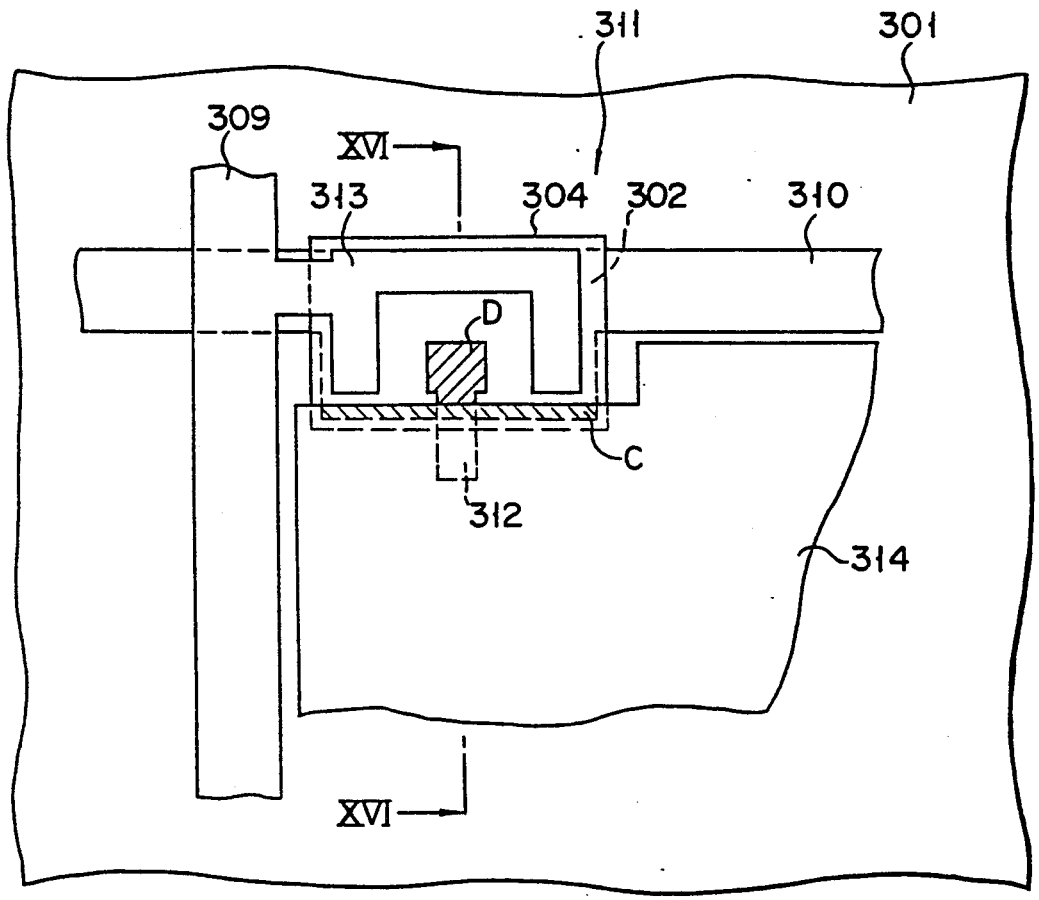
FIG. 16 is a plan view showing a TFT as a modification to which the present invention can be applied.
Figure 17:
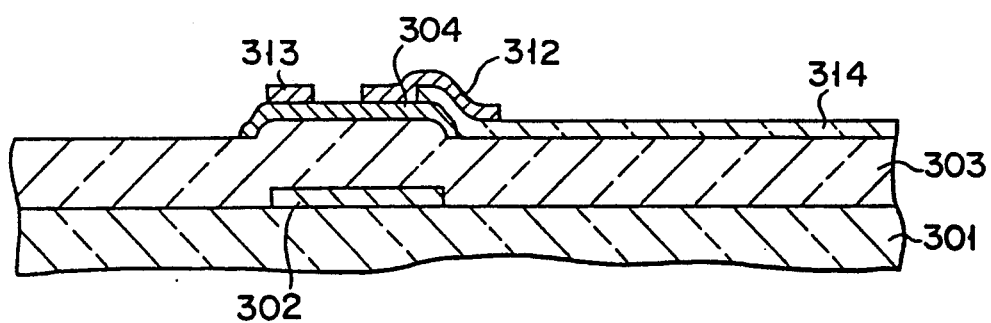
FIG. 17 is a sectional view showing the TFT in FIG. 16 taken along line XVI—XVI thereof.

A structure of a TFT according to still another embodiment will be described with reference to FIGS. 16 and 17. Since the fundamental structure of this TFT is the same as that of the TFT in FIGS. 14 and 15, the same reference numerals in FIGS. 16 and 17 denote the same parts as in FIGS. 14 and 15, and a description thereof will be omitted. Referring to FIGS. 16 and 17, a source electrode 312 of TFT 311 has a rectangular shape. U-shaped a drain electrode 313 is formed so as to surround rectangular the source electrode 312. Similarly, in TFT 311, the area of the source electrode 312 is made small, and hence the area where the source and the gate electrodes 312 and 302 overlap each other is small. Therefore, a gate-source capacitance $C_{GS}$ between the gate and the source electrodes 302 and 312 is small, and the influence of a gate signal on a source potential is small. In addition, since a drain electrode 313 is formed so as to surround the source electrode 312, a channel width can be set to be sufficiently large.

Furthermore, in order to increase the opening ratio by increasing the area of a pixel electrode 314 as much as possible, the pixel electrode 314 is extended so that it partially overlaps the gate electrode 302 a indicated by cross-hatched portions in FIG. 16. In this case, the gate-source capacitance $C_{GS}$ between the gate and the source electrodes 302 and 312 is determined by the sum of areas D and C where the gate and the source electrodes 302 and 312, and the gate and the pixel electrodes 312 and 314 overlap each other, as indicated by the cross-hatched portions in FIG. 16. Therefore, area C where the gate and the pixel electrodes 302 and 314 overlap each other, and area D where the gate and the source electrodes 302 and 312 overlap each other are determined such that gate-source capacitance $C_{GS}$ determined by areas C and D becomes sufficiently small compared with an equivalent capacitance $C_{LC}$ between one pixel electrode 314 and an electrode opposing the pixel electrode 314 through a liquid crystal.

Note that the source and the drain electrodes 312 and 313 may be formed into polygonal shapes without an acute angle, such as a pentagon and a hexagon, or elliptical shapes.

What is claimed is:

1. A thin film transistor, comprising:
    a gate electrode formed on a part of a surface of a transparent insulative substrate;
    a gate insulating film formed on said substrate so as to cover at least said gate electrode;
    a semiconductor film, having a channel portion defined at a first surface part thereof, and being formed on at least said gate insulating film;
    source and drain electrodes formed on surface parts of said semiconductor film different from said first surface part at which said channel portion is defined so as to be separated from each other by a predetermined distance;
    an insulating film covering at least said drain electrode and said gate insulating film and having a first surface which faces toward said gate insulating film and a second surface which faces away from said gate insulating film, wherein said insulating film has a varying thickness for flattening level differences caused by said gate insulating film and said semiconductor film being stacked on said substrate so that said second surface of the insulating film is substantially flat; and
    a transparent electrode formed on at least part of said second surface of said insulating film except for a portion above the channel portion on said semiconductor film, and electrically connected to said source electrode.

2. A thin film transistor according to claim 1, wherein said insulating film is formed over the entire surface of said substrate except for a part where said source electrode and transparent electrode are electrically connected to each other, and said transparent electrode is formed on said insulating film.

3. A thin film transistor according to claim 2, wherein a thickness of a portion of said insulating film on said drain and source electrodes is smaller than 8,000 Å.

4. A thin film transistor according to claim 2, wherein said transparent electrode is formed on said insulating film except for a section which opposes said drain electrode.

5. A thin film transistor according to claim 2, wherein said insulating film has a through hole formed at a position of said source electrode, and said transparent electrode is electrically connected to said source electrode via said through hole.

6. A thin film transistor according to claim 5, further comprising
a contact metal made of conductive metal material and embedded in said through hole.

7. A thin film transistor according to claim 6, wherein said contact metal is formed as accumulated laminas, on said transparent electrode formed on said through hole.

8. A thin film transistor according to claim 6, wherein said transparent electrode is formed on said conductive metal material embedded in said through hole so as to be in contact with said conductive metal material.

9. A thin film transistor according to claim 1, wherein said thin film transistor has said gate electrode, said gate insulating film, said semiconductor film, and said source and drain electrodes all of which have identical edge shapes.

10. A thin film transistor array for use in a liquid crystal display device, comprising:
a transparent insulative substrate;
a plurality of gate lines and drain lines arranged in row and column directions on said substrate, for connecting to thin film layers deposited on said substrate;
a plurality of thin film transistors arranged on said substrate in the form of a matrix at cross points of said gate lines and said drain lines, each of said transistors comprising:
a gate electrode formed on a part of a surface of said substrate;
a gate insulating film formed on said substrate so as to cover at least the gate electrode;
a semiconductor film, having a channel portion defined at a first surface part thereof, and being formed on at least said gate insulating film;
source and drain electrodes formed on surface parts of said semiconductor film different from said first surface part at which said channel portion is defined so as to be separated from each other by a predetermined distance;
an insulating film covering at least said drain electrode and said gate insulating film and having said second surface which faces toward said gate insulating film and a second surface which faces away from said gate insulating film, wherein said insulating film has a varying thickness for flattening level differences caused by said plurality of thin film transistors on said substrate so that said second surface is substantially flat; and
a transparent electrode formed on at least part of said second surface of said insulating film except for a portion above the channel portion on said semiconductor film, and electrically connected to said source electrode.

11. A thin film transistor array according to claim 10, wherein
said insulating film is coated over the entire surface of said substrate except for sections where said plurality of source electrodes of said plurality of thin film transistors are electrically connected to each of said transparent electrodes, and said plurality of transparent electrodes are formed and arranged on said electrode insulating film in the form of a matrix.

12. A thin film transistor array according to claim 11, wherein said insulating film comprises first and second films, said first film comprising a flattening film formed by coating and baking a viscous material, and second film being formed of an insulating material deposited on said first film by CVD.

13. A thin film transistor array according to claim 11, wherein
said plurality of transparent electrodes are formed on said insulating film except for sections opposing said channel portions of said thin film transistors connected to adjacent transparent electrodes.

14. A thin film transistor array according to claim 13, wherein said transparent electrodes are located with their edged vertically aligned with, or overlapping, the edges of said drain electrodes and the edges of said drain and gate lines of said thin film transistors, respectively.

15. A thin film transistor array according to claim 11, wherein insulating film has a plurality of through holes formed therein at positions corresponding to said source electrodes of said plurality of thin film transistors, and said plurality of transparent electrodes are electrically connected to said source electrodes of the corresponding thin film transistors through said through holes.

16. A thin film transistor array according to claim 15, further comprising a shield film formed on said insulating film above said channel portions of said semiconductor films of said thin film transistors, and contact metals formed in only said through holes and on said insulating film covered with said shield films.

17. A thin film transistor array according to claim 15, further comprising contact metals comprising metal conductive materials buried in said plurality of through holes, said plurality of transparent electrodes being stacked on said insulating film so as to be electrically connected to said metal conductive materials.

18. A thin film transistor array according to claim 10, wherein each of said plurality of thin film transistors has said gate electrode, said gate insulating film, said semiconductor film, and said source and drain electrodes all of which have identical edge shapes.

* * * * *